United States Patent [19]
Miyazaki et al.

[11] Patent Number: 5,704,357
[45] Date of Patent: Jan. 6, 1998

[54] METHOD OF PRODUCING MR IMAGE AND MRI SYSTEM

[75] Inventors: Mitsue Miyazaki, Otawara; Yoshimori Kassai, Kawasaki, both of Japan

[73] Assignee: Kabushiki Kaisha Toshiba, Kawasaki, Japan

[21] Appl. No.: 456,078

[22] Filed: May 31, 1995

[30] Foreign Application Priority Data

May 31, 1994 [JP] Japan ................... 6-119140

[51] Int. Cl.$^6$ ................................................. A61B 5/055
[52] U.S. Cl. ................... 128/653.2; 324/307; 324/309
[58] Field of Search ................. 128/653.2; 324/307, 324/309

[56] References Cited

U.S. PATENT DOCUMENTS

| | | |
|---|---|---|
| 4,914,391 | 4/1990 | Leroux . |
| 5,050,609 | 9/1991 | Balaban et al. ................ 128/653 |

FOREIGN PATENT DOCUMENTS

| | | |
|---|---|---|
| 0 572 074 A1 | 12/1993 | European Pat. Off. . |
| 93/01509 | 1/1993 | WIPO . |

OTHER PUBLICATIONS

Frahm et al., "Stimulated Echo Imaging", Journal of Magnetic Resonance 64, 81–93 (1985).

Pauly et al., "A k-Space Analysis of Small-Tip-Angle Excitation", Journal of Magnetic Resonance 81, 43–56, 1989.

Hennig et al. "Fast Imaging using Burst Exciation Pulses", 1994.

P.S. Melki and R.V.Mulkern, *Magnetization Transfer Effects in Multislice RARE Sequences*, Magnetic Resonance in Medicine 24, 189–195 (1992).

J. Hennig, *Multiecho Imaging Sequences with Low Refocusing Flip Angles*, Journal of Magnetic Resonance 78, pp. 397–407 (1988).

*Primary Examiner*—Marvin M. Lateef
*Assistant Examiner*—Shawna J. Shaw
*Attorney, Agent, or Firm*—Limbach & Limbach L.L.P.

[57] ABSTRACT

A magnetic resonance imaging uses a fast SE-related multiple slice technique which permits a decreased SAR, a reduced MTC effect, and still offers excellent image contrast. The imaging includes a process of applying to an object placed in a static magnetic field a one excitation RF pulse in synchronization with a pulse of slice-selective magnetic field gradient applied to the object; a process of consecutively applying to the object a plurality of refocusing RF pulses each of which being applied in synchronization with another pulse of slice-selective magnetic field gradient applied to the object; and a process of consecutively acquiring a plurality of spin echoes emanated from the object each with a pulse of phase-encoding magnetic field gradient applied to the object, each of said plurality of spin echoes being emanated responsively to each of said plurality of refocusing RF pulses. A flip angle of one of the refocusing RF pulses is set to a first value which is either equal to or less than 180°, said one of the refocusing RF pulses being assigned for phase-encoding at each location in a phase-encoding direction of a central block containing a non-encoding location of a k-space into which the spin echoes are mapped every block. Flip angles of the remaining refocusing RF pulses are set to a second value smaller than the first value.

18 Claims, 7 Drawing Sheets

REFOCUSING OF ENCODING BLOCK CONTAINING A NON-ENCODING LOCATION

METHOD OF PRODUCING MR IMAGE AND MRI SYSTEM

BACKGROUND OF THE INVENTION

1. Field of the Invention

The present invention relates to a method of producing magnetic resonance (MR) images and to a magnetic resonance imaging (MRI) system, and in particular, to the method and system enabling fast imaging based on a fast spin echo technique.

2. Description of the Related Art

Various sequences for acquiring image data are employed in the field of magnetic resonance imaging recently. One of them is a spin echo (SE) technique in which a 90° excitation pulse and a 180° refocusing pulse are used.

Fast SE imaging (also referred to as multi-echo scan imaging) technique intended to shorten scan time is a known form of spin echo imaging technique. In fast SE imaging one 90° pulse and a plurality of 180° pulses are applied. Spin echoes are then generated and phase-encoded to the extent different among blocks defined in a direction of phase encoding in a Fourier space (k-space). The spin echoes are then mapped into the Fourier space. For example, a 90° excitation pulse is applied first, and then a plurality of 180° refocusing pulses are applied consecutively (in the case of triple-echo imaging) in order to acquire a plurality of spin echoes. The plurality of spin echoes are phase-encoded to the extent dependent on locations in plural blocks mapped and defined in the direction of phase encoding of the k-space or Fourier space. The plurality of spin echoes are then mapped into the respective blocks sequentially. This sequence is repeated by a required number of echo times, so that spin echoes will be mapped into the whole of the Fourier space. Thereafter, two-dimensional Fourier transformation is carried out to produce an image. This scan technique provides a plurality of spin echoes with the single application of a 90° excitation pulse, thus proving useful in drastically decreasing scan time.

As mentioned above, the fast SE imaging is thought suitable for multiple slice imaging designed to image a volume composed of a plurality of slices because of the decreased scan time.

The flip angles of radio-frequency (hereinafter RF) pulses serving as refocusing pulses are not limited to the aforesaid 180° (180° pulse) but may be any other constant value such as 140° or 100°. The number of refocusing pulses (that is, spin echoes) used after every excitation has become a large value such as twelve or fifteen per excitation in recent years.

When the aforesaid conventional fast SE imaging is employed, the number of echoes is limited for fear of a specific absorption rate (hereinafter SAR) which is a reference value indicating an amount of magnetic energy accumulated in a patient's body might exceed the upper limit. It is therefore impossible at present to increase the number of echoes and shorten scan time (the scan time is shortened at the rate of "one/the number of echoes") beyond a certain limit.

In addition, when multiple slice imaging is performed using the fast SE technique, the signal strengths of acquired echoes degrade due to a magnetization transfer contrast (hereinafter MTC) effect (refer to U.S. Pat. No. 5,050,609). This results in a lowered signal-to-noise (hereinafter S/N) ratio. In addition, the SAR reaches the upper limit as mentioned above. The number of slices cannot therefore be increased further.

When multiple slice imaging is performed using the conventional fast SE technique, the MTC effect is exerted. Therefore, when the number of slices or echoes is changed, image contrast varies due to changed echo strength (this problem is pointed out by, for example, Melki, P. S. and Mulkern, R. V. in "Magnetic Resonance Medicine" (Vol. 24, P. 189–195 (1992)).

SUMMARY OF THE INVENTION

The present invention attempts to overcome the underlying situation and problems of the aforesaid prior art. An object of the present invention is to provide a method of producing a MRI system that suppresses the MTC effect and the SAR when magnetic resonance imaging is performed using a fast SE technique.

For solving the above problem, in one aspect of the present invention, there is provided a method of producing a magnetic resonance image of an object placed in a static magnetic field, the method comprising repititiously the steps of: applying to the object a one excitation RF pulse in synchronization with a pulse of slice-selective magnetic field gradient applied to the object; consecutively applying to the object a plurality of refocusing RF pulses each of which being applied in synchronization with another pulse of slice-selective magnetic field gradient applied to the object; and consecutively acquiring a plurality of spin echoes emanated from the object each with a pulse of phase-encoding magnetic field gradient applied to the object, each of said plurality of spin echoes being emanated responsively to each of said plurality of refocusing RF pulses, wherein a flip angle of one of the refocusing RF pulses is set to a first value which is either equal to 180° or less than 180°, said one of the refocusing RF pulses being assigned for phase-encoding at each location in a phase-encoding direction of a central block containing a non-encoding location of a k-space into which the spin echoes are mapped every block; and flip angles of the remaining refocusing RF pulses are set to a second value smaller than the first value.

It is preferred that the second flip angle is a constant value independently of each phase-encoding position of the k-space. The first flip angle is less than 180°, for example.

It is also preferred that the first flip angle is 80° and said second flip angle is 60°.

It is also preferred that the second flip angle is gradually lowered correspondingly to a distance advancing from the central encoding block along the phase-encoding direction. Preferably, the first flip angle is less than 180°.

It is still preferred that the pulse of slice-selective magnetic field gradient and said another pulse of slice-selective magnetic field gradient are for a pulse sequence multiple slice imaging.

It is still preferred that the first flip angle is 180°.

It is still preferred that the magnetic resonance image is a T1 contrast image of the object. Preferably, the first refocusing RF pulse applied first among said plurality of refocusing RF pulses is 180° in flip angle, said first refocusing RF pulse being mapped on the central encoding block.

According to another aspect of the present invention, there is provided a magnetic resonance imaging system in which an object is placed in a static magnetic field, comprising: means for applying to the object a one excitation RF pulse in synchronization with a pulse of slice-selective magnetic field gradient applied to the object; means for consecutively applying to the object a plurality of refocusing RF pulses each of which is applied in synchronization with another pulse of slice-selective magnetic field gradient applied to the object; and means for consecutively acquiring a plurality of spin echoes emanated from the object each with a pulse of phase-encoding magnetic field gradient applied to the object, each of said plurality of spin echoes being emanated responsively to each of said plurality of refocusing RF pulses, wherein a flip angle of one of the refocusing RF pulses is set to a first value which is either equal to 180° or less than 180°, said one of the refocusing RF pulses being assigned for phase-encoding at each location in a phase-encoding direction of a central encoding block containing a non-encoding location of a k-space into which the spin echoes are mapped every encoding block; and flip angles of the remaining refocusing RF pulses are set to a second value smaller than the first value.

According to a magnetic resonance imaging method and system of the present invention, when a sequence such as a sequence of fast SE-related multiple slice imaging is executed, the flip angle of a refocusing RF pulse to be applied relative to a location in an encoding block containing a non-encoding location and being defined in a direction of phase encoding in a k-space into which spin echoes are mapped is set to a first value smaller than or equal to 180°. The flip angles of refocusing RF pulses to be applied relative to locations in encoding blocks other than the encoding block containing the non-encoding location in the k-space are set to a second value smaller than the first value. Compared with the conventional fast SE imaging, the SAR decreases, the MTC effect is reduced, and image contrast is maintained satisfactory.

DETAILED DESCRIPTION OF THE PREFERRED EMBODIMENTS

An embodiment of the present invention will be described with reference to FIGS. 1 to 4.

Figure 1:
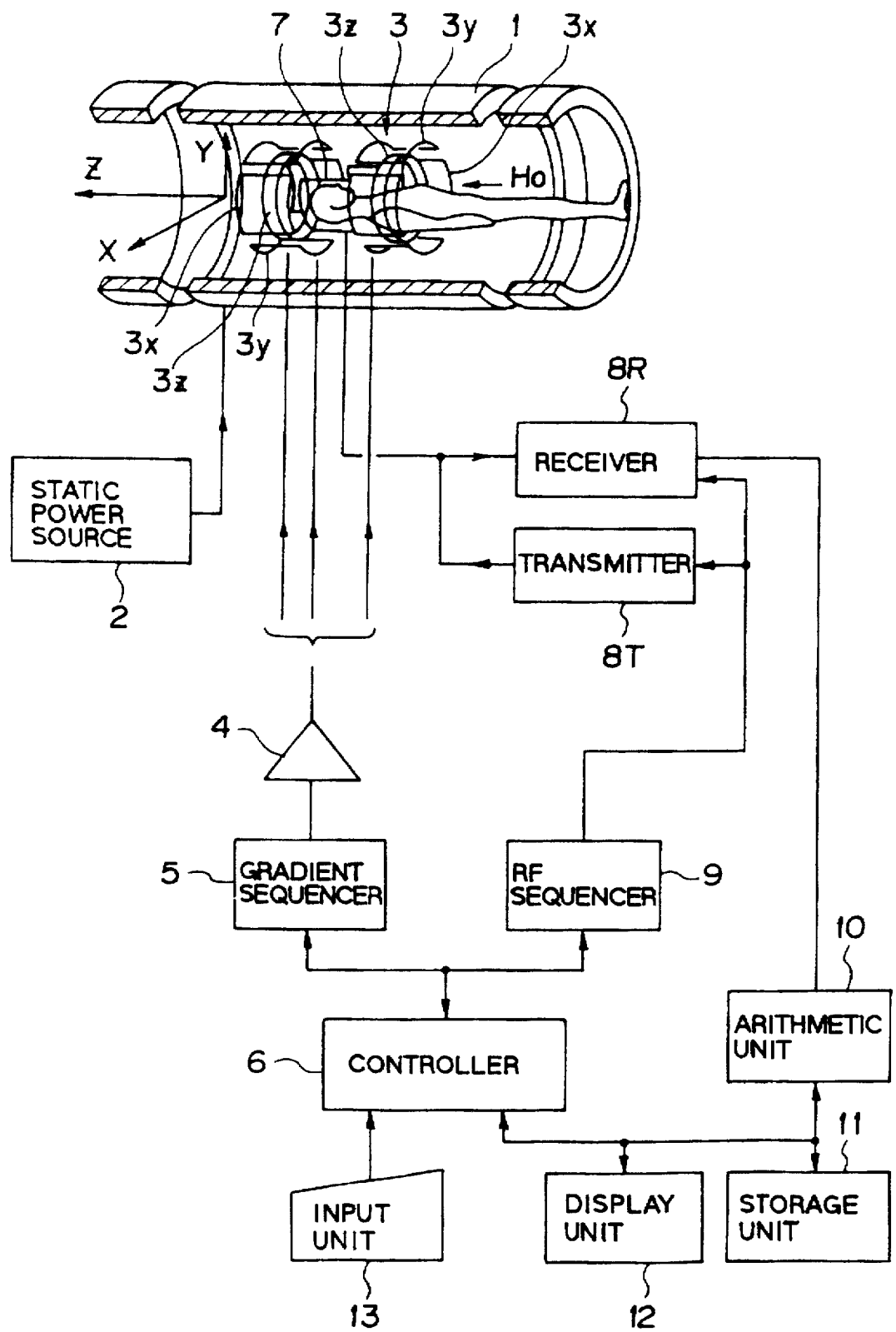
FIG. 1 is a block diagram showing a magnetic resonance imaging system in accordance with an embodiment of the present invention.

FIG. 1 shows the outline configuration of a magnetic resonance imaging system in accordance with the present invention. The magnetic resonance imaging system comprises a magnet unit 1 for generating a static magnetic field, a magnetic field gradient unit for defining locations relative to the static magnetic field, a transmitter/receiver that is responsible for selective exciting and receiver MR signals, and a control and arithmetic unit responsible for system control and image reconstruction.

The magnet unit includes a magnet 1 that is, for example, a superconducting magnet, and a static power source 2 for supplying current to the magnet 1. The magnet unit generates a static magnetic field $H_O$ in a z-axis direction in a cylindrical diagnostic space into which a patient P is inserted.

The magnetic field gradient unit includes three sets of gradient coils 3x to 3z designed to produce magnetic field gradients in x-, y-, and z-axis directions respectively and incorporated in the magnet 1, a gradient power source 4 for causing current to flow into the magnetic coils 3x to 3z, and a gradient sequencer 5 for controlling the power source 4. The sequencer 5 includes a computer and receives a signal commanding execution of an acquisition sequence of multiple slice imaging using fast SE imaging (See FIG. 2) from a controller 6 (including a computer) responsible for control of the whole system. According to the sequence, the gradient sequencer 5 applies pulses of magnetic field gradients oriented in the x-, y-, and z-axis directions and controls the quantities of the magnetic field gradients. Thus, the magnetic field gradients are convoluted to the static magnetic field $H_O$. In this embodiment, the one of three magnetic field gradients oriented in the z-axis direction is regarded as a slice selective magnetic field gradient $G_S$. The magnetic field gradient oriented in the x-axis direction is regarded as a readout magnetic field gradient $G_R$. The magnetic field gradient oriented in the y-axis direction is regarded as a phase-encoding magnetic field gradient $C_E$.

The transmitter/receiver includes an RF coil to be placed in the vicinity of the patient P in the scanning space inside the magnet 1, a transmitter 8T and receiver 8R to be connected to the coil 7, and an RF sequencer 9 (including a computer) for controlling the timing of actuating the transmitter 8T and receiver 8R. The transmitter 8T delivers RF pulses with the Larmor frequency to the RF coil 7 so as to cause excitation that results in magnetic resonance, and the receiver 8R performs various signal processing schemes on MR (RF) signals received by the RF coil 7 so as to form digital signals.

The control and arithmetic unit includes the aforesaid controller 6 as well as an arithmetic unit 10 that inputs digital data represented by MR signals and provided by the receiver 8R and that produces image data through computation, a storage unit 11 for storing the resultant image data, a display unit 12 for displaying an image, and an input unit 13. Specifically, the arithmetic unit 10 maps measurement data into a two-dimensional Fourier space preserved as a memory space and performs Fourier transform so as to achieve image reconstruction. The controller 6 controls the actions of the gradient sequencer 5 and RF sequencer 9 and manages the timing of activating them in synchronization with them.

Figure 3:
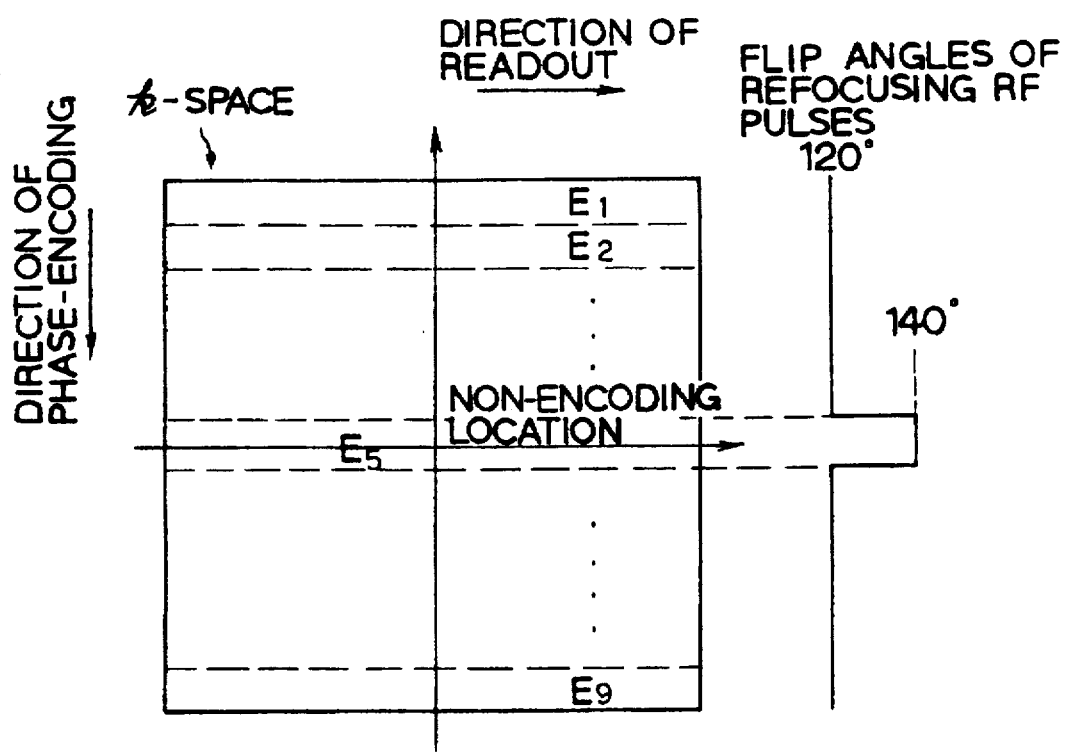
FIG. 3 is an explanatory diagram concerning control of flip angles of refocusing pulses dependent on locations in a k-space in accordance with the embodiment.

Assuming that the number of echoes employed in fast SE imaging is nine, a Fourier space (that is a k-space whose matrix size is, for example, 256 by 256 elements) has, as shown in FIG. 3, nine blocks E1 to E9 defined by mapping blocks dividing the matrix by nine in a direction of phase encoding (the fraction is included in the size of a center block containing a non-encoding location by means of software) and elongated in a direction of readout. The non-encoding location lies in a center block E5.

First to nine spin echoes S1 to S9 resulting from fast SE imaging are phase-encoded in any order and allotted to these respective blocks E1 to E9.

Figure 2:
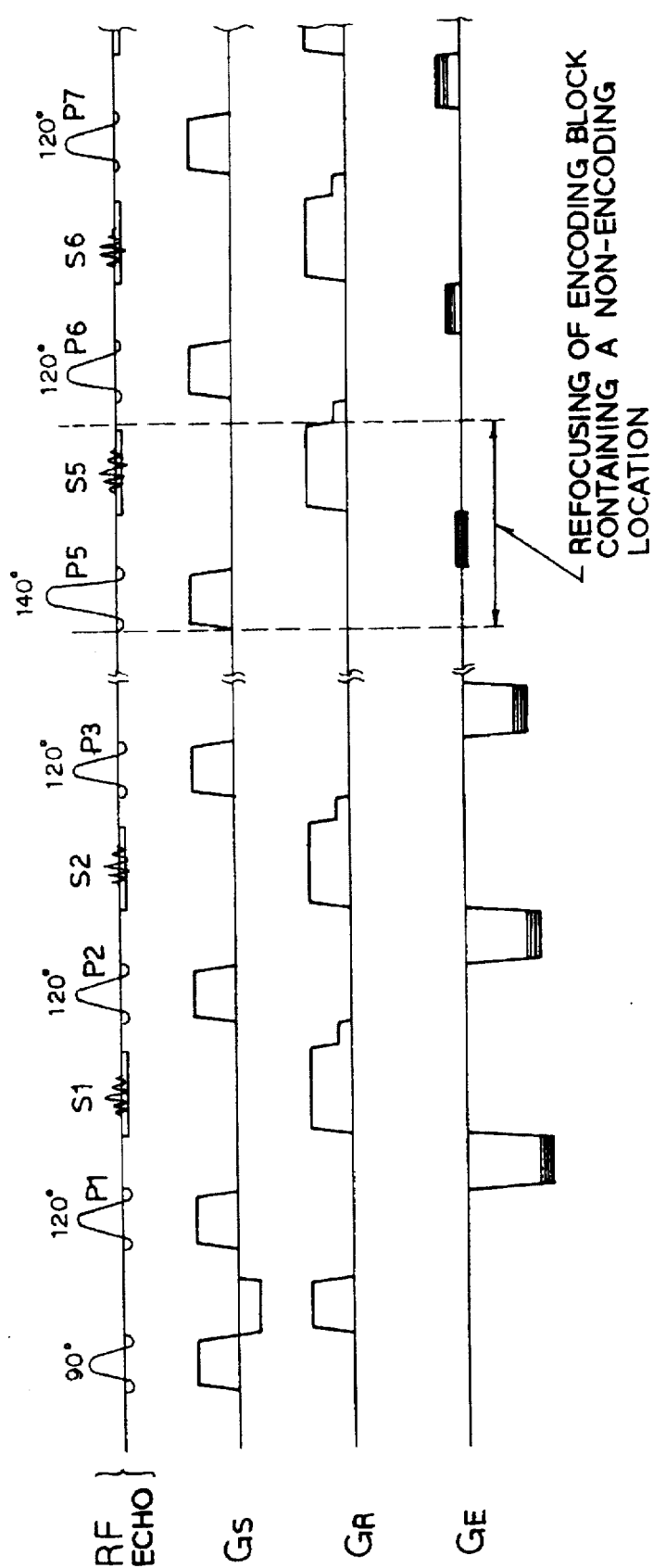
FIG. 2 shows a pulse sequence used in the course of multiple slice imaging using an improved fast SE technique of the present method.

For fast SE-based multiple slice imaging in accordance with this embodiment, when a spin echo is acquired relative to the block E5 including the non-encoding location in the k-space, a refocusing RF pulse (for example, the fifth refocusing RF pulse P5 to be applied to produce the fifth spin echo S5; any order of refocusing is acceptable.) has a flip angle of 140° (this pulse is referred to as a 140° pulse) rather than 180°. The remaining refocusing RF pulses (for example, pulses P1 to P4 and P6 to P9) have a flip angle smaller than 140°, for example, 120° (these pulses are referred to as 120° pulses). In other words, as shown in FIGS. 2 and 3, the flip angles of refocusing RF pulses to be applied relative to all blocks except the block containing the non-encoding location are set to an appropriate value smaller than 180° (for example, 120°; however, 60° or any other value is acceptable), while the flip angle of the refocusing RF pulse to be applied relative to the non-encoding block is set to a value slightly larger than the ones of the other refocusing RF pulses (for example, 140°; however, 80° or any other value is acceptable).

Employment of a flip angle smaller than 180° is intended to decrease the SAR. Any of values obtained through experiments and simulations is adopted as long as it will not cause intended image contrast and resolution to vary. Adoption of a larger flip angle for the refocusing RF pulse to be applied relative to the block containing the non-encoding location is intended to provide excellent image contrast. Any of values obtained through experiments and simulations is adopted as long as a difference between flip angles will not bring about image artifacts.

Next, the operation of this embodiment will be described.

First, when the controller 6 commands execution of an acquisition sequence of fast SE-based multiple slice imaging in accordance with the present invention, the gradient sequencer 5 and RF sequencer 9 follow the sequence so as to impose magnetic field gradients on the patient P and to transmit and receive RF signals.

First, the slice-selective magnetic field gradient $G_S$ is applied by the gradient coils 3z, 3z carrying current supplied by the gradient power source 4. When the magnetic field gradient $G_S$ reaches a certain strength, one 90° pulse serving as an excitation RF pulse is applied by the transmitter 8T via the RF coil 7. A region of the patient having a given width and forming one of multiple slices is selected and excited, and the spins of nuclei existent within the slice plane are turned to align themselves with a y' axis (rotational coordinates).

With the inversion of the slice-selective magnetic field gradient $G_S$, the readout magnetic field gradient $G_R$ is applied by the gradient coils 3x, 3x.

Next, similarly to the 90° pulse, a first 120° pulse P1 serving as a refocusing RF pulse is applied together with the pulse of slice-selective magnetic field gradient $G_S$. This causes the spins of the nuclei to turn 120° about the y' axis.

Next, the phase-encoding magnetic field gradient $G_E$ whose magnetic field strength is adjusted for each encoding is applied to the patient P relative to a given location in, for example, the block E1 by the gradient coils 3y, 3y carrying current supplied from the gradient power source 4. This causes the spins of the nuclei existent within the slice plane to turn by a phase with respect to the encoding location.

Thereafter, a first spin echo S1 is produced responsively to the first refocusing. At this time, the readout magnetic field gradient $G_R$ is applied by the gradient coils 3x, 3x. The first spin echo S1 is acquired by the RF coil 7 in the duration until the magnetic field gradient $G_R$ has a certain strength.

After a second 120° pulse P2 is applied together with the pulse of slice-selective magnetic field gradient $G_S$ in the same manner as the first 120° pulse is, the phase-encoding magnetic field gradient $G_E$ is applied relative to a given location in a different block, for example, the block E2. A resultant second spin echo S2 is acquired by the RF coil 7 with the imposition of the readout magnetic field gradient $G_R$.

Likewise, 120° pulses P3 and P4 and thereafter are applied in order to acquire spin echoes S3 and S4 and thereafter.

When the time of refocusing relative to the block E5 containing the non(zero)-encoding location in the k-space comes, a pulse whose flip angle is larger than 120° but smaller than 180°; that is, a 140° pulse is applied as a refocusing RF pulse synchronously with the pulse of slice-selective magnetic field gradient $G_S$. During this refocusing, similar to the duration of any other refocusing, a spin echo S5 is acquired responsively to the 140° pulse.

Thereafter, spin echoes S6 to S9 are acquired by applying the 120° pulse relative to the remaining blocks.

The control of the changing flip angles "120° to 140° to 120°" is achieved by a CPU incorporated in the gradient sequencer 5 which determines the timing of switching the flip angles.

The foregoing sequence is repeated by the number of times calculated by dividing the number of matrix elements arranged in the direction of phase-encoding by the number of echoes (for example, 256 by 9) (the fraction is processed by means of software). The sequence is further repeated by the number of slices to be imaged during multiple slice imaging.

Spin echoes received through the repetition of the sequence are sent sequentially to the receiver 8R, and subjected to amplification, intermediate-frequency transform, phase detection, and low-frequency amplification therein. The resultant spin echoes are converted into digital signals and supplied to the arithmetic unit 10. The arithmetic unit 10 maps the digital data into the Fourier (k) space preserved in a memory in units of phase-encoded echoes. The mapped data in the Fourier space is then subjected to two-dimensional Fourier transform, whereby a slice image is reconstructed. The reconstructed image is stored in the storage unit 11. The image reconstruction is then rerun to handle the data rendering the next slice.

As mentioned above, the flip angles of all refocusing RF pulses are set to values smaller than 180°, and the flip angle of a refocusing RF pulse to be applied relative to a block containing a non-encoding location is set to a larger value (for example, 140° as mentioned above) than the one (for example, 120° as mentioned above) set for the other refocusing RF pulses. Consequently, as long as fast SE imaging is concerned, the SAR decreases. This results in a larger difference from the upper limit of the SAR, whereby it becomes possible to increase the number of echoes. Eventually, the scan time can be further shortened.

For example, when the present invention applies to multiple slice imaging in which the number of echoes is fifteen and the flip angle of a refocusing RF pulse to be applied relative to a block containing a non-encoding location in a k-space is 80° and the flip angles of the other refocusing RF pulses are 60°, there is provided, as follows, a ratio between the SAR* in the above-assumed conditions and the $SAR_{con}$ permitted by the conventional fast SE sequence in which the flip angles of all refocusing RF pulses are set to 180°.

$$SAR^*/SAR_{con} = (80° \times 1 + 60° \times 14)^2 / (180° \times 15)^2$$

In consequence, the SAR in the above-assumed conditions should theoretically be reduced to approximate one-eighths of the conventional SAR. Even when the number of echoes is increased from fifteen to thirty, there arises no problem in terms of the SAR. Furthermore, the scan time can be shortened to be half of the one required when the number of echoes is fifteen.

When multiple slice imaging is performed using the fast SE technique as mentioned in terms of this embodiment, the number of slices may be increased by a decrease in SAR. This contributes to improvement in performance of the imaging system.

Since the flip angles of refocusing RF pulses are small, the MTC effect is suppressed. Furthermore, the signal quantities of acquired spin echoes are retained at larger values than the one provided when the conventional 180° pulse is employed. This leads to the markedly improved S/N ratio.

The flip angles of refocusing RF pulses are set to values that are small but still permit excellent contrast. The MTC effect can therefore be suppressed. Even when the number of slices to be handled during multiple slice imaging is changed, excellent image contrast is maintained.

According to this embodiment, distortion in a proton density (PD) (dual echo) image shrinks due to minimized blurring.

Figure 4:
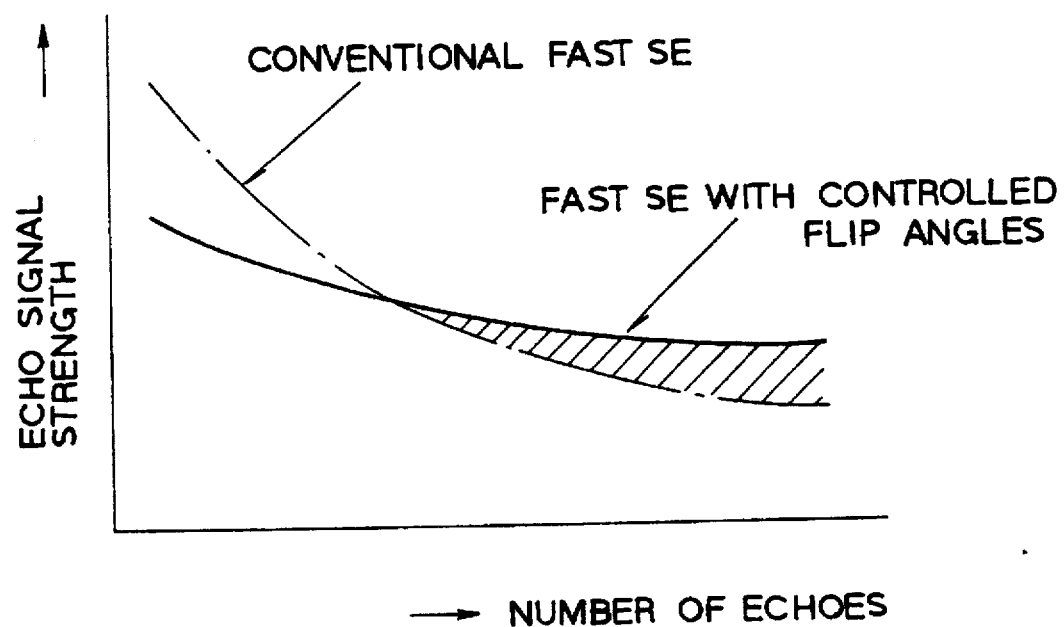
FIG. 4 is a graph showing a curve plotted to indicate the signal strength of permitted by fast SE imaging accompanied by switching of flip angles versus the number of echoes in comparison with a curve plotted to indicate the signal strength permitted by the conventional fast SE imaging versus the number of echoes.

FIG. 4 shows the qualitative change in echo signal strength due to the increase in the number of echoes. In the graph, the dashed and continuous lines represent the changes according to the conventional fast SE sequence and the fast SE with flip angles controlled, respectively; both the lines are obtained when imaging is carried out for an object having MTC effect. As seen from the graph, the fast SE with controlled flip angles provides higher signal strength than conventional one in a certain higher range in the number of echoes, as shown by the slant region. In most cases, the number of echoes existing in such a higher range is used for multiple slice imaging, thereby higher signal strength being provided to increase the S/N ratio regardless of MTC effect.

The number of echoes used in fast SE imaging in accordance with this embodiment is not limited to nine as shown in FIG. 2. Any number of echoes is acceptable as long as echoes can be acquired. The flip angles of refocusing RF pulses can be set to any values as long as image contrast will not degrade (for example, 60° and 80°, wherein 80° is employed relative to the encoding block containing a non-encoding location in the direction of phase encoding). If necessary, this embodiment can be adapted to fast SE-based single slice imaging.

Figure 5:
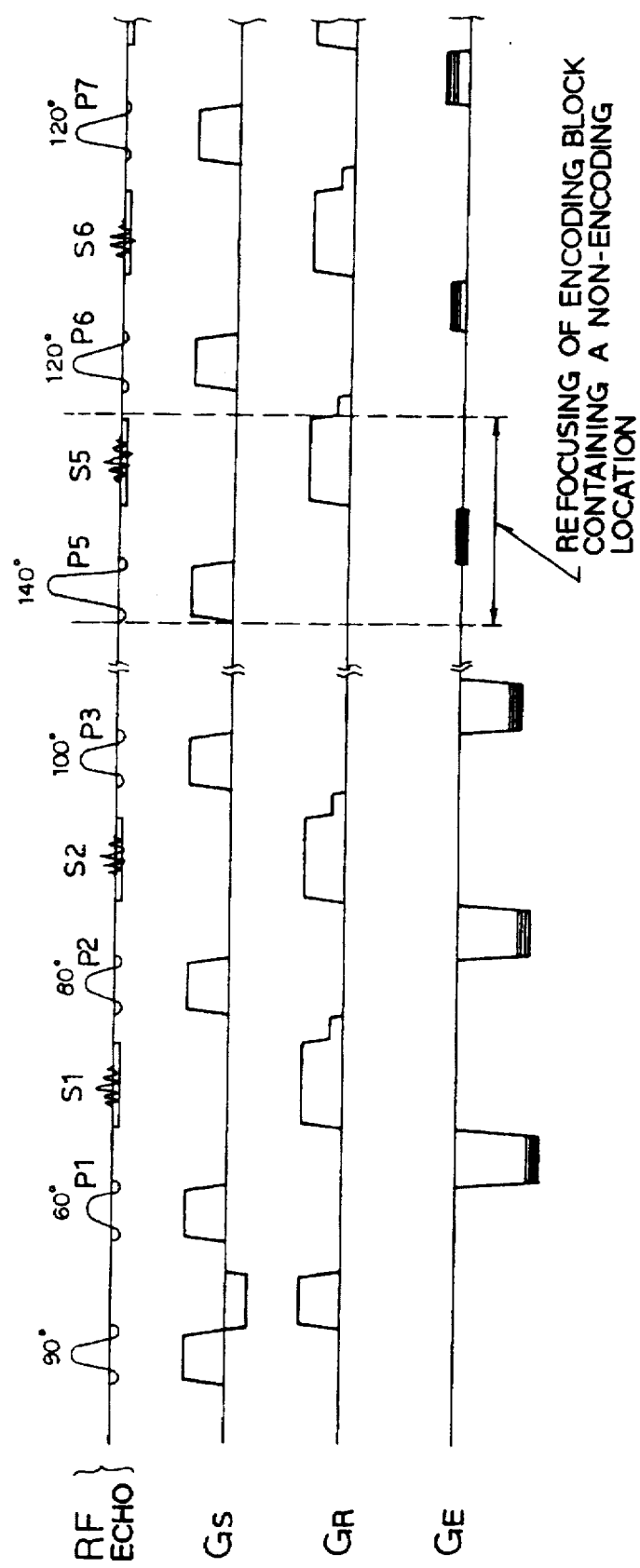
FIG. 5 shows a pulse sequence used in the course of multiple slice imaging using an improved fast SE technique in accordance with a variant of the present invention.
Figure 6:
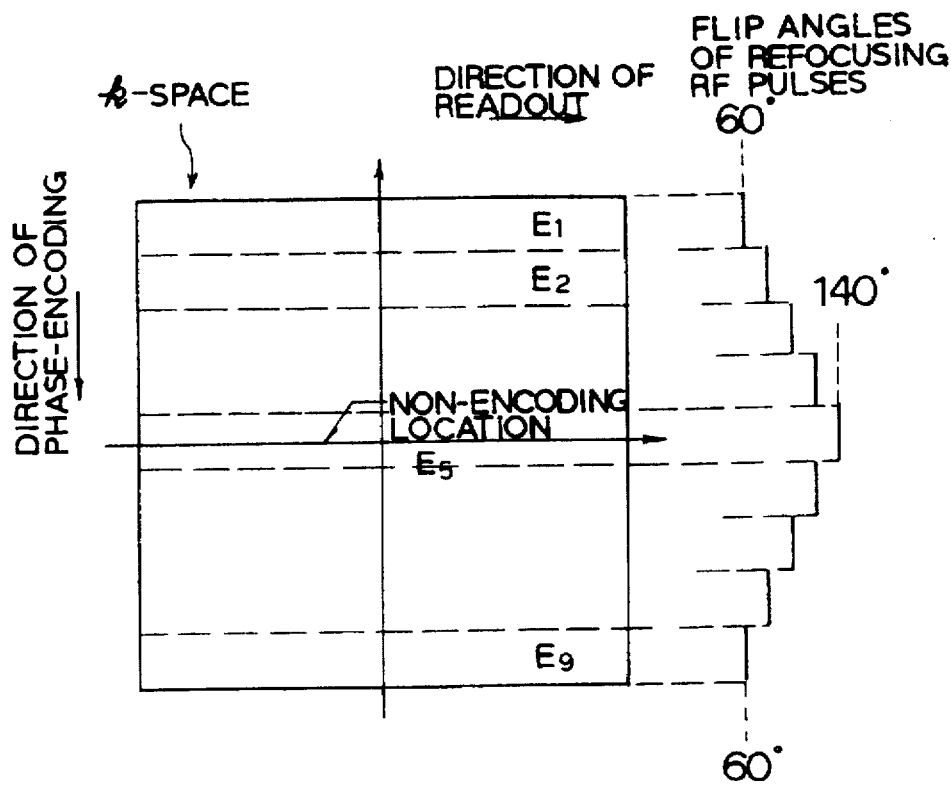
FIG. 6 is an explanatory diagram concerning control of flip angles of refocusing pulses dependent on locations in a k-space in accordance with the variant.

A variant of the present invention will be described in conjunction with FIGS. 5 and 6. A magnetic resonance imaging system in accordance with this variant is, as shown in FIG. 5, dedicated to fast SE-based multiple slice imaging similar to the aforesaid embodiment. Refocusing RF pulses, which is applied after excitation using a 90° pulse as an excitation RF pulse, have moderately changing flip angles.

To be more specific, the flip angles of all refocusing RF pulses are maintained at values smaller than 180°. Herein, the flip angle of a refocusing RF pulse to be applied relative to a block containing a non-encoding location in a direction of phase encoding in a k-space is set to 140°. The flip angles of the other refocusing RF pulses to be applied relative to blocks receding from the center encoding block containing the non-encoding location decrease gradually to 60° in decrements of 20° (See FIG. 6). The flip angles are set to values determined in consideration of image contrast and the SAR.

The other components of the variant and the operation thereof are identical to those of the aforesaid embodiment. The variant has the same advantage as the embodiment. Despite the unchanged SAR, the flip angle of an RF pulse to be applied relative to a non-encoding location is made larger. This results in an image contrast equivalent to an image produced solely using 180° pulses.

Even in the variant, the number of echoes and the flip angles is not limited to the ones described above but may be set to any values determined in consideration with the image contrast and SAR.

Figure 7:
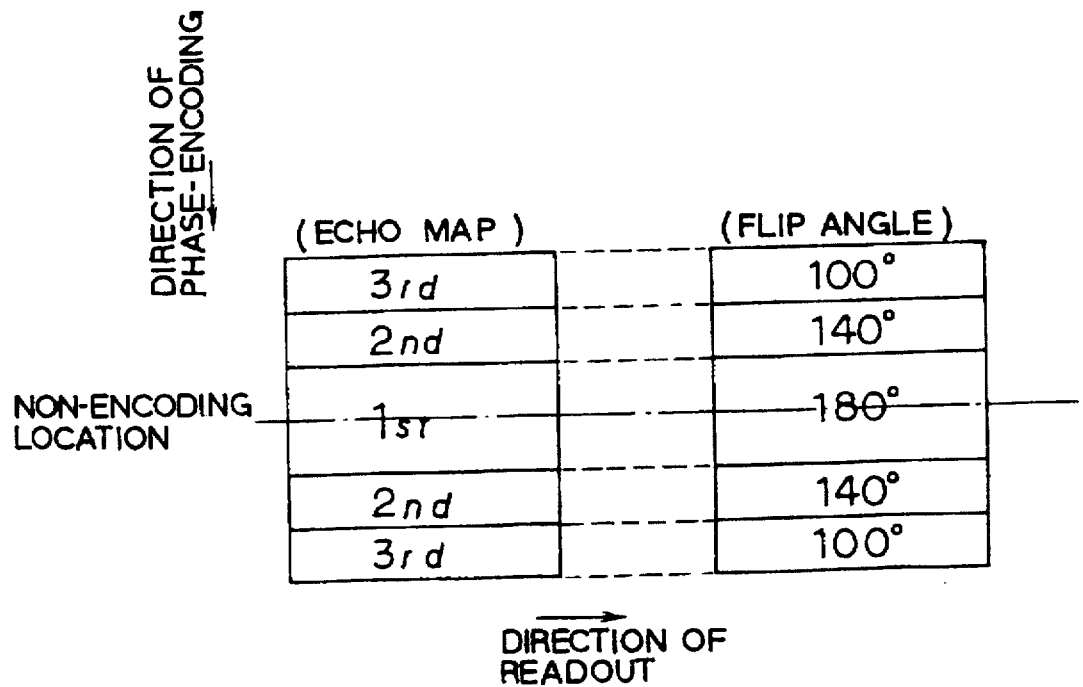
FIG. 7 is a schematic diagram showing locations into which echoes are mapped in one-to-one correspondence to flip angles in accordance with another variant.

FIG. 7 shows another variant. This variant is adapted to production of a T1 (PD) contrast image. A T1 image is produced by mapping echoes in the order shown in FIG. 7. The first echo is acquired using a 180° refocusing pulse (or a pulse having a smaller flip angle) in the same manner as it is refocused according to the conventional method, so that sufficient contrast can be obtained. The subsequent echoes are acquired by refocusing pulses having smaller flip angles, because they are indifferent to image contrast. Thus, for production of a T1 contrast image, this variant has the same advantage as the aforesaid variant.

Figure 8:
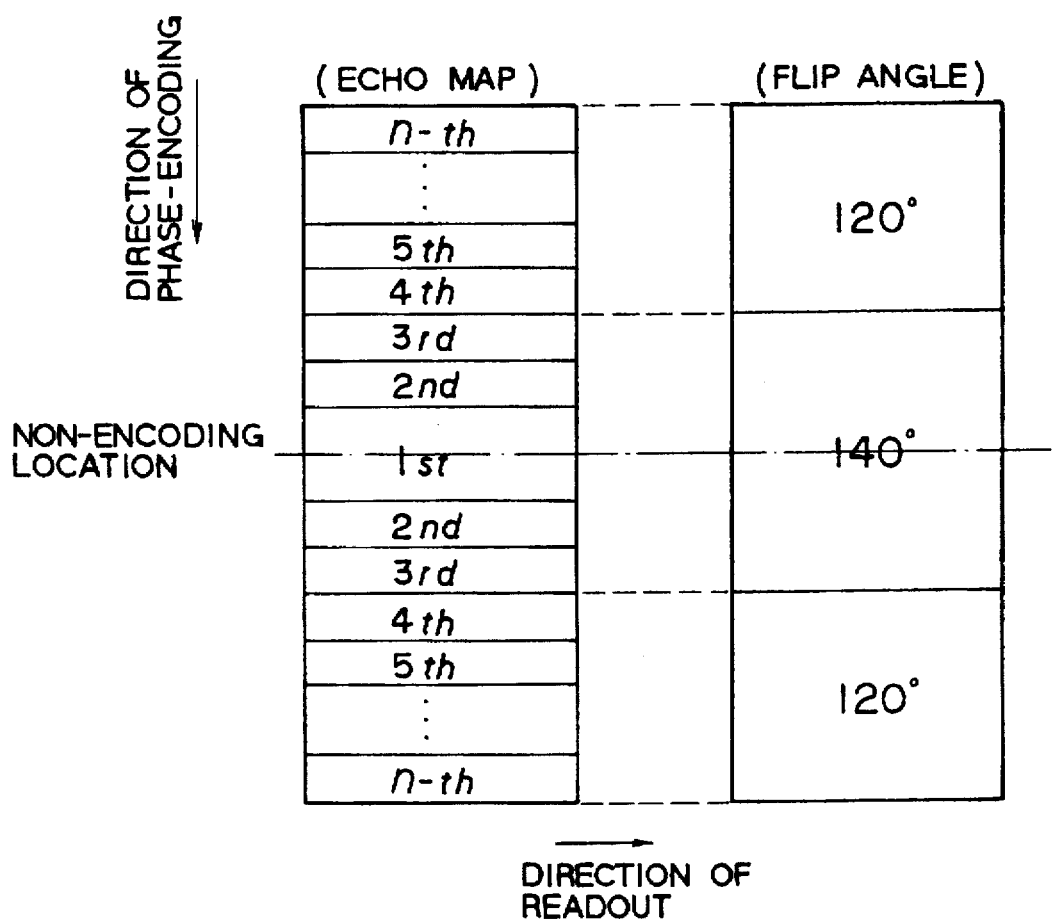
FIG. 8 is a schematic diagram showing locations into which echoes are mapped in one-to-one correspondence to flip angles in accordance with still another variant.

FIG. 8 shows still another variant which is also preferable to a T1 contrast image. The echo mapping order is represented in the figure. A plurality of the first to third echoes (not only the first echo), for example, are each acquired using a 140° refocusing pulse of a higher flip angle 140°, while the subsequent echoes are all acquired using a 120° refocusing pulse of a lower flip angle 120°. This variant is still advantageous to the T1 contrast image in this variant, the number of such a plurality of echoes adopted to a higher flip angle can be changeable and the flip angles of the refocusing pulses are changeable with holding the difference between higher and lower flip angles.

For the sake of completeness it should be mentioned that the embodiments and variants described above are not a definitive list of possible embodiments. The expert will appreciate that it is possible to modify the present invention to various other MRI pulse sequences without departing from the basic inventive principle.

What is claimed is:

1. A method of producing a magnetic resonance image of an object placed in a static magnetic field on the basis of a pulse sequence including repetitions each comprising the steps of:

applying to the object a one excitation RF pulse in synchronization with a pulse of slice-selective magnetic field gradient applied to the object;

consecutively applying to the object a plurality of refocusing RF pulses each of which being applied in synchronization with another pulse of slice-selective magnetic field gradient applied to the object; and consecutively acquiring a plurality of spin echoes emanated from the object each with a reading-out magnetic field gradient applied to the object, each of said plurality of spin echoes responding to each of said plurality of refocusing RF pulses and being acquired after a reading out magnetic field gradient applied to the object, wherein each of the acquired plurality of spin echoes is mapped in each of a plurality of blocks defined by dividing a k(Fourier)-space along a phase-encoding direction of the k-space; a flip angle of one specified refocusing RF pulse of the refocusing RF pulses is set to a first value equal to or less than 180°, said specified refocusing RF pulse being assigned for refocusing one specified spin echo of the plurality of spin echoes mapped in one specified block of the plurality of blocks, the specified block including a non-encoding location in the k-space; and a flip angle of the remaining refocusing RF pulse is set to a second value smaller than the first value.

2. The method of claim 1, wherein said second value of the flip angle is a constant value independent of each position in the phase-encoding direction in the k-space.

3. The method of claim 2, wherein said first value of the flip angle is less than 180°.

4. The method of claim 1, wherein said first value of the flip angle is 80° and said second value of the flip angle is 60°.

5. The method of claim 1, wherein said plurality of refocusing RF pulses and said second value of the flip angle is gradually lowered every refocusing RF pulse as the remaining two or more refocusing RF pulses becoming far on time basis from the specified refocusing RF pulse.

6. The method of claim 5, wherein said first value of the flip angle is less than 180°.

7. The method of claim 1, wherein said pulse sequence is a pulse sequence for multiple slice imaging.

8. The method of claim 1, wherein said first value of the flip angle is 180°.

9. The method of claim 1, wherein said magnetic resonance image is a T1 constrast image of the object.

10. The method of claim 9, wherein a first refocusing RF pulse applied first among said plurality of refocusing RF pulses is the specified refocusing RF pulse.

11. A magnetic resonance imaging system in which an object is placed in a static magnetic field on the basis of a pulse sequence, comprising:

means for applying to the object a one excitation RF pulse in synchronization with a pulse of slice-selective magnetic field gradient applied to the object;

means for consecutively applying to the object a plurality of refocusing RF pulses each of which being applied in synchronization with another pulse of slice-selective magnetic field gradient applied to the object; and means for consecutively acquiring a plurality of spin echoes emanated from the object with a pulse of reading-out magnetic field gradient applied to the object, each of said plurality of spin echoes responding to each of said plurality of refocusing RF pulses and being acquired after a reading out magnetic field gradient applied to the object, wherein each of the acquired plurality of spin echoes is mapped in each of a plurality of blocks defined by dividing a k(Fourier)-space along a phase-encoding direction of the k-space; a flip angle of one specified refocusing RF pulse of the refocusing RF pulses is set to a first value equal to or less than 180°, said specified refocusing RF pulse being assigned for refocusing one specified spin echo of the plurality of spin echoes mapped in one specified block of the plurality of blocks, the specified block including a non-encoding location in the k-space; and a flip angle of the remaining refocusing RF pulse is set to a second value smaller than the first value.

12. A magnetic resonance imaging system in which an object is placed in a static magnetic field and imaged using a pulse sequence of fast spin echo (FSE) including a one excitation RF pulse and a plurality of refocusing RF pulses following the excitation RF pulse and generating a plurality of spin echoes, the system comprising:

an RF coil for transmitting to the object the excitation RF pulse and the plurality of refocusing RF pulses;

a transmitter for driving the RF coil in order to transmit the excitation RF pulse and the plurality of refocusing RF pulses; and a sequencer for controlling the transmitter on the basis of the pulse sequence wherein a flip angle of specified one of the refocusing RF pulses is set to a first value equal to or less than 180° and the flip angle of remaining refocusing RF pulse is set to a second value smaller than the first value, said specified refocusing RF pulse being assigned for refocusing one of the spin echoes mapped in a divided block to be echo-mapped including a zero encoding location in a k(Fourier)-space.

13. The system of claim 12, wherein said second value of the flip angle is a constant value independent of each position in the phase-encoding direction in the k-space.

14. The system of claim 13, wherein said first value of the flip angle is less than 180°.

15. The system of claim 12, wherein said first value of the flip angle is 80° and said second value of the flip angle is 60°.

16. The system of claim 15, wherein said plurality of refocusing RF pulses are at least three refocusing RF pulses and said second value of the flip angle is gradually lowered every refocusing RF pulse as the remaining two or more refocusing RF pulses becoming far on time basis from the specified refocusing RF pulse.

17. The system of claim 12, wherein said magnetic resonance image is either one of a T1 or T2 contrast image of the object.

18. The method of claim 1, wherein said magnetic resonance image is a T2 contrast image of the object.

* * * * *